(12) United States Patent
Masumoto et al.

(10) Patent No.: US 7,586,117 B2
(45) Date of Patent: Sep. 8, 2009

(54) FIELD EFFECT TRANSISTOR AND METHOD OF PRODUCING SAME

(75) Inventors: Akane Masumoto, Yokohama (JP); Daisuke Miura, Numazu (JP); Tomonari Nakayama, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 377 days.

(21) Appl. No.: 10/583,126

(22) PCT Filed: Mar. 16, 2005

(86) PCT No.: PCT/JP2005/005306
§ 371 (c)(1), (2), (4) Date: Jun. 16, 2006

(87) PCT Pub. No.: WO2005/091394
PCT Pub. Date: Sep. 29, 2005

(65) Prior Publication Data
US 2008/0277649 A1 Nov. 13, 2008

(30) Foreign Application Priority Data
Mar. 24, 2004 (JP) .............................. 2004-087077

(51) Int. Cl.
H01L 51/30 (2006.01)
H01L 51/40 (2006.01)
C07D 487/22 (2006.01)

(52) U.S. Cl. .................. 257/40; 257/E51.041; 438/99; 540/145

(58) Field of Classification Search .................. 257/40, 257/E51.041; 438/99; 540/145
See application file for complete search history.

(56) References Cited

U.S. PATENT DOCUMENTS

| | | | |
|---|---|---|---|
| 5,659,181 A | 8/1997 | Bridenbaugh et al. | 257/40 |
| 7,094,625 B2 | 8/2006 | Miura et al. | 438/99 |
| 7,140,321 B2 | 11/2006 | Nakayama et al. | 118/723 |
| 2003/0226996 A1* | 12/2003 | Aramaki et al. | 252/62.3 Q |
| 2005/0202348 A1 | 9/2005 | Nakayama et al. | 430/311 |
| 2006/0081880 A1 | 4/2006 | Miyazaki et al. | 257/200 |
| 2006/0113523 A1 | 6/2006 | Kubota et al. | 257/40 |
| 2006/0145141 A1 | 7/2006 | Miura et al. | 257/40 |
| 2006/0214159 A1 | 9/2006 | Nakayama et al. | 257/40 |
| 2007/0012914 A1 | 1/2007 | Miura et al. | 257/40 |
| 2007/0051947 A1 | 3/2007 | Nakayama et al. | 257/40 |
| 2007/0085072 A1 | 4/2007 | Masumoto et al. | 257/40 |
| 2007/0096079 A1 | 5/2007 | Nakayama et al. | 257/40 |

FOREIGN PATENT DOCUMENTS

| | | |
|---|---|---|
| JP | 5-55568 | 3/1993 |
| JP | 5-190877 | 7/1993 |
| JP | 8-264805 | 10/1996 |
| JP | 2003-304014 | 10/2003 |
| JP | 2004-6750 | 1/2004 |

OTHER PUBLICATIONS

Clezy et al. CAS Accession No. 1978:22858.*
T. Akiyama, et al., "Synthesis of .pai.-system-expanded compounds using Diels-Alder reactions", Proceedings of the 81st Annual Spring Meeting of the Chemical Society of Japan, 2002, II, p. 990, 2F9-14. (with translation).
Christos D. Dimitrakopoulos, et al., "Organic Thin Film Transistors for Large Area Electronics", Advanced Materials, vol. 14, No. 2, Jan. 16, 2002, pp. 99-117.
Peter T. Herwig, et al., "A Soluble Pentacene Precursor: Synthesis, Solid-State Conversion into Pentacene and Application in a Field-Effect Transistor", Advanced Materials, vol. 11, No. 6, 1999, pp. 480-483.
W. Nakwaski, et al., "Temperature Profiles in Etched-Well Surface-Emitting Semiconductor Lasers", Japanese Journal of Applied Physics, vol. 30, No. 4A, Apr. 1991, pp. L596-L598.
H. Sirringhaus, et al., "Two-dimensional charge transport in self-organized, high-mobility conjugated polymers", Nature, vol. 401, Oct. 14, 1999, pp. 685-688.

* cited by examiner

Primary Examiner—Rei-Tsang Shiao
Assistant Examiner—Joseph R Kosack
(74) Attorney, Agent, or Firm—Fitzpatrick, Cella, Harper & Scinto (57) ABSTRACT

A field effect transistor is provided which comprises an organic semiconductor layer comprising a compound having a monobenzoporphyrin skeleton represented by the general formula (1):

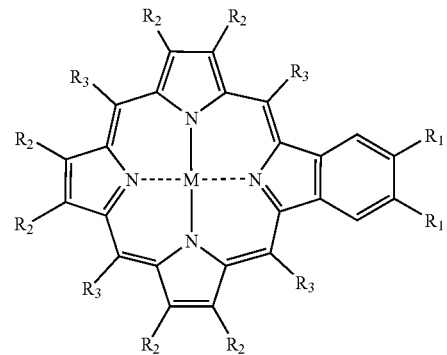

wherein $R_1$ and $R_2$ are independently selected from the group consisting of a hydrogen atom, a halogen atom, a hydroxyl group, and alkyl, alkenyl, oxyalkyl, thioalkyl, alkyl ester and aryl groups each having 1 to 12 carbon atoms with the proviso that adjacent $R_1$ may be the same or different and adjacent $R_2$ may be the same or different and that at least two of $R_2$ are not hydrogen atoms; $R_3$ is a hydrogen atom or an aryl group; and M denotes two hydrogen atoms, a metal atom or a metal oxide.

2 Claims, 5 Drawing Sheets

FIELD EFFECT TRANSISTOR AND METHOD OF PRODUCING SAME

TECHNICAL FIELD

The present invention relates to a field effect transistor, and a method of producing the same, which employs monobenzoporphyrin in its active layer.

BACKGROUND ART

The development of thin-film transistors employing an organic semiconductor gradually began to become more active in the latter half of the 1980s, and has in recent years reached the stage where the thin-film transistor characteristics of amorphous silicon can be exceeded for basic performance. Organic materials are easily worked, and because they have a high affinity with the plastic substrates by use of which thin-film FETs are usually formed, the use of an organic material as the active semiconductor layer in a thin-film device is desirable. Examples of the organic semiconductor include the acenes disclosed in Japanese Patent Application Laid-Open No. H05-55568 such as pentacene and tetracene; the low-molecular-weight compounds disclosed in Japanese Patent Application Laid-Open No. H05-190877 such as phthalocyanines including lead phthalocyanine, perylene and tetracarboxylic acid derivatives thereof; and the polymer compounds disclosed in Japanese Patent Application Laid-Open No. H08-264805, such as aromatic oligomers typified by thiophene hexamers referred to as α-thienyl or sexythiophene, as well as polythiophene polythienylenevinylene and poly-p-phenylenevinylene. (Many of these compounds are also disclosed in Advanced Materials, Vol. 2, p. 99-117, 2002.)

Characteristics such as electrical conductivity and semi-conductivity, which are required for using these compounds for the active layer to produce a device, largely depend on the crystallinity and orientation of the material, in addition to the purity of the material. Because those compounds having an extended π-conjugated system, for example pentacene, have a high crystallinity and are insoluble in solvents, thin-films thereof have been formed by using a vacuum-deposition process. Although it is known in this case that a high mobility is attained, the handling of such compounds has been difficult because pentacene, for example, will quickly be degraded by oxygen or moisture in the air. On the other hand, applied development of organic semiconductors using a π-conjugated polymer as an organic semiconductor film has been progressing owing to the fact that such compounds have excellent formability, such as being easily formed into a thin-film by a solution-coating process or the like ("Japanese Journal of Applied Physics", Japan Society of Applied Physics, Vol. 30, p. 596-598, 1991). In the case of π-conjugated polymers, it is known that the state of structural arrangement of molecular chains have a large influence on the electrical conductive properties. Similarly, it has been reported that the field-effect mobility of π-conjugated polymer field effect transistors largely depends on the state of structural arrangement of molecular chains in semiconductor layers ("Nature", Nature Publishing Group, Vol. 401, p. 685-687, 1999). However, because the arrangement of molecular chains of π-conjugated polymers are effected in a period from coating of a solution to drying of the solution, there is a possibility that the state of arrangement of molecular chains may vary largely depending on changes in environment or coating methods. There has also been reported an FET using a film prepared by forming a thin film of a soluble precursor of pentacene by coating and transforming the precursor to pentacene by heat-treatment ("Advanced Materials", WILLEY-VCH Verlag GmbH, Vol. 11, p. 480-483, 1999). In this case, the conversion to pentacene has required a high-temperature treatment, and eliminated components with a large mass have had to be removed under reduced pressure. Further, it has been reported that tetrabenzoporphyrin obtained by heating at 200° C. porphyrin having bulky bicyclo[2.2.2]octadiene skeletons fused is useful as an organic semiconductor (Proceedings of the 81st Annual Spring Meeting of the Chemical Society of Japan, 2002, II, p. 990, 2F9-14; Japanese Patent Application Laid-Open No. 2003-304014; Japanese Patent Application Laid-Open No. 2004-6750). However, in this case, in order to obtain a crystalline film showing stable characteristics, a high calcinating temperature was required.

DISCLOSURE OF THE INVENTION

As described above, in FET devices employing an organic semiconductor, a semiconductor layer having crystallinity and orientation have been formed through a complicated process such as vacuum film formation.

Furthermore, the adoption of a simple process employing a coating technique to form a film having excellent orientation and crystallinity often required an extremely high temperature, and the range of such temperature was extremely narrow in most cases.

The present invention has been accomplished to solve these problems and it is, therefore, an object of the present invention to provide a field effect transistor and a method of producing a field effect transistor, which can stably form an organic semiconductor layer having high crystallinity and orientation and exhibiting a high field-effect mobility, at a broad range of temperature including a low temperature.

That is, the present invention provides a field, effect transistor comprising an organic semiconductor layer comprising a compound having a monobenzoporphyrin skeleton represented by the general formula (1):

wherein $R_1$ and $R_2$ are independently selected from the group consisting of a hydrogen atom, a halogen atom, a hydroxyl group, and alkyl, alkenyl, oxyalkyl, thioalkyl, alkyl ester and aryl groups each having to 12 carbon atoms with the proviso that adjacent $R_1$ may be the same or different and adjacent $R_2$ may be the same or different and that at least two of $R_2$ are not hydrogen atoms; $R_3$ is a hydrogen atom or an aryl group; and M denotes two hydrogen atoms, a metal atom or a metal oxide.

The present invention also provides a field effect transistor comprising an organic semiconductor layer comprising a compound having a monobenzoporphyrin skeleton, wherein the organic semiconductor layer has at least one peak at Bragg angle (2θ) 7.8°±0.2° in terms of Cu K-alpha X-ray diffraction.

The present invention further provides a field effect transistor characterized in that $R_1$ and $R_3$ of the monobenzoporphyrin compound represented by the general formula (1) are hydrogen atoms and at least two of R2 are alkyl groups having 1 to 12 carbon atoms.

The present invention also provides a field effect transistor characterized in that M of the monobenzoporphyrin compound represented by the general formula (1) is two hydrogen atoms or one copper atom.

The present invention further provides a method of producing a field effect transistor, which comprises the step of heating a monobicycloporphyrin compound represented by the general formula (2):

wherein $R_1$, $R_2$ and $R_4$ are independently selected from the group consisting of a hydrogen atom, a halogen atom, a hydroxyl group, and alkyl, alkenyl; oxyalkyl, thioalkyl, alkyl ester, and aryl groups each having to 12 carbon atoms with the proviso that adjacent $R_1$ may be the same or different and adjacent $R_2$ may be the same or different and that at least two of $R_2$ are not hydrogen atoms; $R_3$ is a hydrogen atom or an aryl group; and M denotes two hydrogen atoms, a metal atom or a metal oxide, to effect conversion to a monobenzoporphyrin compound represented by the general formula (1):

wherein $R_1$, $R_2$, $R_3$, and M are as above defined.

The present invention also provides a method of producing a field effect transistor characterized in that the monobicycloporphyrin compound represented by the general formula (2) is heated at a temperature between 130° C. to 250° C. to be converted to the monobenzoporphyrin compound represented by the general formula (1).

According to the present invention, because an organic semiconductor layer having high crystallinity and orientation can stably be formed at a broad range of calcination temperature including a low temperature, not only heat-resistant substrates such as a glass substrate, but also various kinds of plastic substrates can be employed. Further, this makes it possible to provide a field effect transistor that can be produced easily and shows a high field-effect mobility, and a method of producing the field effect transistor.

BEST MODE FOR CARRYING OUT THE INVENTION

The field effect transistor (FET) in accordance with one embodiment of the present invention is a device having at least an organic semiconductor, an insulator and a conductor. The insulator is an insulating film (layer) for covering the conductor, which serves as an electrode. The organic semiconductor is an organic semiconductor layer which responds to stimulus (electric field) generated by the conductor (electrode). Specifically, the organic semiconductor layer is a layer the electrical characteristics of which vary depending on an electric field, and more specifically is a layer in which the electrical conductivity, or in other words a current flowing through the organic semiconductor layer, varies in response a change in the electric field.

In addition to the above-described three constituent elements, the FET in accordance with the present invention may also have a source electrode and a drain electrode. In such a case, the above-mentioned conductor can be used as a gate electrode. Further, the above-mentioned insulating layer can be used as a gate insulating layer for covering the gate electrode to insulate the gate electrode from the organic semiconductor layer, source electrode and drain electrode.

Figure 1:
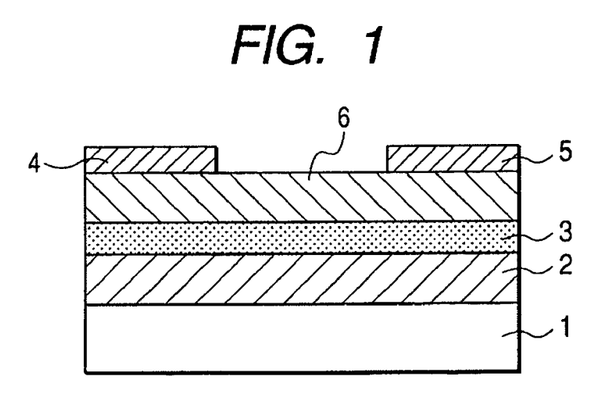
FIG. 1 is an expanded cross-sectional view schematically illustrating a part of a top electrode type field effect transistor in accordance with the present invention.

FIG. 1 is a schematic cross-sectional view illustrating a top electrode type organic semiconductor device in accordance with the present embodiment. Reference numeral 1 denotes a substrate, 2 denotes a gate electrode, 3 denotes a gate insulating layer, 4 denotes a source electrode, 5 denotes a drain electrode and 6 denotes an organic semiconductor layer. In this device, the gate electrode 2 is provided on the surface of the substrate 1 and the gate insulating layer 3 is provided thereon; and the source electrode 4 and the drain electrode 5 are arranged above the surface of the insulating layer 3 with a gap therebetween. Moreover, the organic semiconductor layer 6 is provided on the source electrode 4 and the drain electrode 5 and on the insulating layer 3, which serves as a separating region therefor, so as to be in contact with the electrodes 4 and 5. The insulating layer 3 is provided so as to cover the gate electrode 2.

Figure 2:
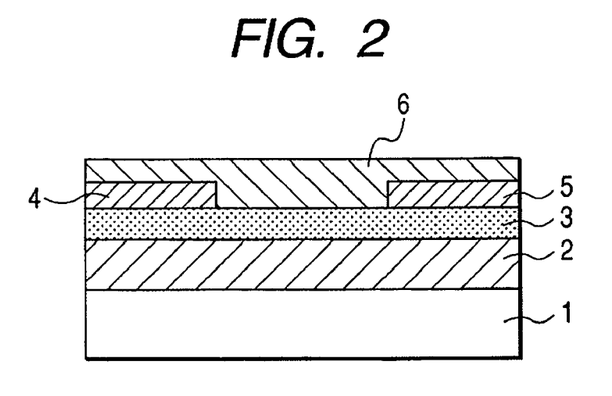
FIG. 2 is an expanded cross-sectional view schematically illustrating a part of a bottom electrode type field effect transistor in accordance with the present invention.

FIG. 2 is a schematic cross-sectional view illustrating a bottom electrode type organic semiconductor device in accordance with the present embodiment. Reference numeral 1 denotes a substrate, denotes a gate electrode, 3 denotes a gate insulating layer, 4 denotes a source electrode, denotes a drain electrode and 6 denotes an organic semiconductor layer. In this device, the gate electrode 2 is provided on the surface of the substrate 1 and the gate insulating layer 3 is provided thereon; and the source electrode 4 and the drain electrode 5 are arranged above the surface of the insulating layer 3 with a gap therebetween. Moreover, the organic semiconductor layer 6 is provided on the source electrode 4 and the drain electrode 5 and on the insulating layer 3, which serves as a separating region therefor, so as to be in contact with the electrodes 4 and 5. The insulating layer 3 is provided so as to cover the gate electrode 2.

In order to increase the responsiveness of the transistor in the present embodiment, the material of the organic semiconductor layer 6 is required to show a high mobility. Accordingly, as a result of continued investigation to find an organic semiconductor material that can stably form an organic semiconductor layer having high crystallinity and orientation at a broad range of calcination temperature, the present inventors have discovered that a compound having the specific monobenzoporphyrin skeleton represented by the general formula (1):

can preferably be used.

Further, the present inventors have made the findings that a simple field effect transistor showing a high field-effect mobility can be attained by employing as the organic semiconductor layer 6 a compound having the monobenzoporphyrin skeleton represented by the general formula (1).

Then, the above-described problems have been resolved for the first time to arrive at the present invention by using a compound represented by the general formula (1), wherein $R_1$ and $R_2$ are independently selected from the group consisting of a hydrogen atom, a halogen atom, a hydroxyl group, and alkyl, alkenyl, oxyalkyl, thioalkyl, alkyl ester and aryl groups each having 1 to 12 carbon atoms with the proviso that adjacent $R_1$ may be the same or different and adjacent $R_2$ may be the same or different and that at least two of $R_2$ are not hydrogen atoms; $R_3$ is a hydrogen atom or an aryl group; and M denotes two hydrogen atoms, a metal atom or a metal oxide.

Moreover, it is preferable that at least two of $R_2$ are alkyl groups. This increases the orientation of the porphyrins, which improves the mobility.

Although there are several methods for forming the thin film, such as a method of vapor-depositing monobenzoporphyrin, a method of carrying out vapor deposition while converting a precursor to monobenzoporphyrin, and a method of applying a precursor and then effecting heating, the method of applying a precursor then effecting heating is preferred.

Next, the precursor will be described. In the porphyrin compound represented by the general formula (2) as a precursor, the substituents $R_1$ to $R_3$ each have the same definition as that for the general formula (1), and the substituents $R_4$ bonded to bicyclo[2.2.2]octadiene ring are eliminated in the form of $R_4$—CH=CH—$R_4$ when converted by heating to the monobenzoporphyrin compound represented by the general formula (1). Therefore, $R_4$ may independently be selected from the group consisting of a hydrogen atom, a halogen atom, a hydroxyl group, and alkyl, alkenyl, oxyalkyl, thioalkyl, alkyl ester, and aryl groups each having 1 to 12 carbon atoms, or may be a combination of two or more thereof. If the number of carbon atoms exceeds 12, the molecular weight of a eliminated component increases to leave the eliminated component in a benzoporphyrin compound film, so that sufficient semiconductor characteristics are not obtained. It is most preferable that $R_4$ is a hydrogen atom.

General Formula (2):

The substituent $R_1$ of the porphyrin compound remains as a substituent in the monobenzoporphyrin compound obtained after the heat treatment. Therefore, the substituent $R_1$ affects the orientation of the monobenzoporphyrin. $R_1$ may independently be selected from the group consisting of a hydrogen atom, a halogen atom, a hydroxyl group, and alkyl, alkenyl, oxyalkyl, thioalkyl, alkyl ester and aryl groups each having 1 to 12 carbon atoms, or may be a combination of two or more thereof. If the number of carbon atoms of $R_1$ exceeds 12, the existence ratio of the porphyrin ring to the whole molecule decreases, which makes difficult the orientation of the porphyrin rings, so that sufficient semiconductor characteristics may not be obtained. Most preferably, $R_1$ is a hydrogen atom, whereby the stacking of porphyrin rings occurs more easily, which enhances the crystallinity of a film.

The substituent $R_2$ of the porphyrin compound influences the solubility and crystallinity. $R_2$ may independently be selected from the group consisting of a hydrogen atom, a halogen atom, a hydroxyl group, and alkyl, alkenyl, oxyalkyl, thioalkyl, alkyl ester, and aryl groups each having 1 to 12 carbon atoms, or may be a combination of two or more thereof. If the number of carbon atoms of $R_2$ exceeds 12, the existence ratio of the porphyrin ring to the whole molecule decreases, which makes difficult the orientation of the porphyrin rings, so that sufficient semiconductor characteristics are not obtained. However, in general, the porphyrins have extremely poor solubility to common solvents due to the problem of stacking caused by the large planeness thereof. For this reason, purifying techniques commonly used in organic synthesis, such as chromatography and recrystallization, cannot be employed. Nevertheless, because high-purification of the material is critical in order to obtain good semiconductor characteristics, it is preferable that at least two of $R_2$ are substituents having from 2 to 12 carbon atoms. It is more preferable that 2 or more of $R_2$ are alkyl groups having 2 to 12 carbon atoms.

The M of the porphyrin compound is not particularly limited, provided that M is two hydrogens, or a metal or metal oxide. Examples of the metal include copper, gold, silver, zinc, nickel, chromium, magnesium, lithium, and the like. Examples of the metal oxide include TiO, VO and the like. Most preferably, M is two hydrogen atoms or one copper atom.

Preferable examples of the method of forming the organic semiconductor layer include a method in which a monobicycloporphyrin compound represented by the general formula (2) is dissolved in an organic solvent, coated on a substrate and then heated to obtain a crystallized film of a monobenzoporphyrin compound represented by the general formula (1). The organic solvent to be used for dissolving the monobicycloporphyrin compound is not particularly limited, provided that it does not react with the porphyrin compound nor precipitate the compound. Further, two or more solvents may be used as a mixture. In consideration of the smoothness of a surface of a coating film and the uniformity of the film thickness, there are preferably used those solvents that include halogenated organic solvents such as chloroform, methylene chloride, dichloroethane, chlorobenzene, 1,2-dichloroethylene, etc. and aromatic solvents such as xylene, toluene, etc. Although the concentration of the solution may be arbitrarily adjusted depending on the desired film thickness, it is preferably from 0.01 to 5% by weight. Examples of the coating method include a spin casting method, a dipping method, a dropping method, a printing method such as an offset or screen printing or an ink jet method. Further, it is desirable to preliminarily filter the solution through a membrane filter in order to prevent the intrusion of dirt or the like into a semiconductor layer as far as possible. This is because insolubles or intrusion of dirt from the outside prevents uniform orientation, cause an increase in the OFF-state current and a reduction in the ON/OFF ratio. A coating film of the monobicycloporphyrin may also be preliminarily dried at a temperature of 100° C. or lower.

A coated film of the porphyrin compound causes a retro Diels-Alder reaction by heating to effect conversion to a monobenzoporphyrin compound accompanied by elimination of $R_4$—CH=CH—$R_4$. At the same time as the formation of the benzoporphyrin compound, crystal growth is caused by the stacking of porphyrin rings, thereby providing a crystallized film of the monobenzoporphyrin compound. Although the elimination reaction occurs at 125° C. or more, the preferable heating temperature for obtaining a higher field-effect mobility is from 130 to 250° C. Specifically, a crystallized film with sufficient crystal growth cannot be obtained at a temperature of lower than 130°, while cracks will be generated due to an abrupt shrinkage of the film when the temperature exceeds 250° C. Means for the heating include, but are not limited to, a hot plate, a hot air-circulating oven or a vacuum oven.

Further, in order to improve the uniformity of a coating film of the bicyclo compound solution on an Insulating layer, and to make the benzo compound film have a uniform orientation by heating, it is also possible to modify only the insulating film surface. Examples of such a method include a dry treatment using ozone, plasma or a hexamethyldisilane gas and a wet treatment using a solution prepared by dissolving tetraalkoxysilane, trichlorosilane, a surfactant and the like in an organic solvent.

Further, for the purpose of obtaining higher, crystallinity, it is also preferable that the coating film before the heat treatment is subjected to a rubbing treatment in which the film is lightly rubbed with a cloth or the like. The cloth for use in the rubbing treatment includes, but is not limited to, rayon, cotton, silk, or the like. It is preferable that the film thickness of the organic semiconductor layer using the oriented film of the benzoporphyrin compound obtained by this procedure is within the range of 30 to 150 nm. When the film thickness is less than 30 nm, the uniformity of the film thickness will be impaired. On the other hand, when exceeding 150 nm, the mobility will be lowered due to the impairment of the smoothness of the film surface. The growth of the crystal can be confirmed by X-ray diffraction, film surface observation using an optical microscopy, a laser microscopy, a scanning electron microscopy or the like and ultraviolet visible light absorption spectra of the film. It is preferable that the maximum diameter of crystal grains in the organic semiconductor layer is 1 μm or more. If it is less than 1 μm, sufficient field effect mobility cannot be obtained. Further, it is preferable that an intense peak is characteristically observed at Bragg angle (2θ) 7.80±0.2° in terms of Cu K-alpha X-ray diffraction of the organic semiconductor layer. If a strong peak is not observed, adequate orientation may not be achieved.

The X-ray diffraction measurement in the present invention is carried out using Cu K-alpha ray under the following conditions.

Measuring apparatus: RAD-RX wide angle X-ray diffraction apparatus manufactured by Rigakudenki Kogyou Co., Ltd.
X-ray tube: Cu
Tube voltage: 0.50 KV
Tube current: 150 mA
Scan method: 2θ/θ scan
Sampling interval: 0.020 deg.
Integration time: 1 s
Integration Number: 14 times
Measurement temperature: room temperature (20° C.)

In the present invention, the shape of the X-ray diffraction peak may slightly differ depending on the conditions during production. In some cases the peak tip may be split.

As the substrate 1, a substrate worked into a plate shape or sheet shape may be employed which consists of an inorganic material such as Si, glass, metal and the like, or a resin material such as polyethylene terephthalate (PET), polyethylene naphthalate (PEN), polyimide (PI), polyetherimide (PEI), polyethersulfone (PES), polysulfone (PSF), polyphenylenesulfide (PPS), polyetheretherketone (PEEK), polyarylate (PAR), polyamideimide (PAI) and the like. When manufacturing a flexible device, a resin material is preferably employed.

Materials for the gate electrode 2, source electrode 4 and drain electrode 5 are not particularly limited, provided that they are electrically conductive materials, and include platinum, gold, silver, nickel, chromium, copper, iron, tin, antimony, lead, tantalum, indium, aluminum, zinc, magnesium and alloys thereof; conductive metal oxides such as indium-tin oxide; and inorganic and organic semiconductors whose conductivity is increased by doping or the like, for example, monocrystalline silicon, polycrystalline silicon, amorphous-silicon, germanium, graphite, polyacetylene, polyparaphenylene, polythiophene, polypyrrole, polyaniline, polythienylenevinylene, polyparaphenylenevinylene, and the like. Methods of forming the electrodes include sputtering, vapor deposition, a printing method using a solution or paste or an ink-jet method. Further, preferable electrode materials of the above-mentioned are those having a low electrical resistance at a contact surface with the semiconductor layer.

For the insulating film 3, any material may be used, provided that a solution of the compound represented by the general formula (2) can be uniformly coated thereon, but those having a high dielectric constant and a low conductivity are preferred. Examples of such material include inorganic oxides and nitrides such as silicon oxide, silicon nitride, aluminum oxide, titanium oxide and tantalum oxide; and organic polymers such as polyacrylates, polymethacrylates, polyethylene terephthalate, polyimides, polyethers and siloxane-containing polymers. In addition, of the above insulating materials, those having high surface smoothness are preferred.

In order to improve the uniformity of a coating film of the solution of the compound represented by the general formula (2) on the insulating film, and to make uniform the orientation of a film of the compound represented by the general formula (1) by heating, it is also possible to modify only the insulating film surface. Examples of such a method include a dry treatment using ozone, plasma or a hexamethyldisilane gas and a wet treatment using a solution prepared by dissolving tetraalkoxysilane, octadecyltrichlorosilane, trichlorosilane, a surfactant and the like in an organic solvent.

The structure of the field effect transistor in accordance with the present invention is not limited to a thin film type but may be a beam-channel type.

EXAMPLES

Hereinafter, the present invention will be described with reference to synthesis examples and examples. However, the present invention is not limited to these examples.

Synthesis Example

Step <1>
A mixture liquid of 3.16 g (39.5 mmol) of 1,3-cyclohexadiene, 10.5 g (34.1 mmol) of trans-1,2-bis(phenylsulfonyl) ethylene and 200 ml of toluene was refluxed for 7 hours, then cooled and concentrated under reduced pressure to give a reaction mixture. This crude reaction product was recrystallized from chloroform/hexane, giving 5,6-bis(phenylsulfonyl)-bicyclo[2.2.2]octa-2-ene (13.8 g, 35.6 mmol, yield 90%).

Step <2>
The reaction system of a mixture liquid of 7.76 g (20 mmol) of the obtained 5,6-bis(phenylsulfonyl)-bicyclo [2.2.2]octa-2-ene and 50 ml of anhydrous tetrahydrofuran was purged with nitrogen, and 2.425 ml (22 mmol) of ethyl isocyanoacetate was added to the system then cooled to 0° C. After dropping potassium t-butoxide (50 ml/1 M THF solution) over 2 hours, the solution was stirred for 3 hours. After the reaction was finished, dilute hydrochloric acid was added. The reaction mixture was then washed in turn with saturated aqueous sodium bicarbonate solution, distilled water and saturated saline, and dried over anhydrous sodium sulfate. The resulting product was purified using silica gel column chromatography (chloroform) to give ethyl-4,7-dihydro-4,7-ethano-2H-isoindole-1-carboxylate (3.5 g, 1.6 mmol, yield 80%).

Step <3>
2,4-pentanedione (205.4 ml, 2.0 mol), acetone (100 ml), n-butyl bromide (54 ml, 0.5 mol) and potassium carbonate (34.55 g, 0.25 mol) were put in a reaction vessel, purged with nitrogen and refluxed for 48 hours. The generated solid was filtered, and the solvent was removed using an evaporator. Unreacted-2,4-pentanedione was then removed under reduced pressure using a diaphragm. Then, vacuum distillation was then used to obtain 3-n-butyl-2,4-pentanedione (43.25 g, yield 55%).

Step <4>
A reaction vessel was charged with benzyl acetoacetate (97 ml, 560 mmol) and acetic acid (81 ml), and an aqueous solution of sodium nitrite (37.8 g) and water (115 ml) was added dropwise at 10° C. or lower. After dropping, stirring was performed for 3 hours at room temperature. A mixture of zinc powder (36.6 g), sodium acetate (25.9 g) and the above-described solution, were added at lower than 60° C. into a separate vessel with a solution of the 3-n-butyl-2,4-pentanedione (43.16 g, 280 mmol) in acetic acid (45 ml) obtained in Step 3. After stirring for 1 hour at 80° C., the reaction solution was poured into ice water (1.12 L). The formed precipitate was filtered and washed with water. The precipitate was dissolved in chloroform, then washed with water, aqueous sodium bicarbonate solution and saturated saline. The obtained organic layer was dried over anhydrous sodium sulfate and concentrated and then excess liquid was removed by distillation under reduced pressure using a diaphragm. The residue was purified using silica gel column chromatography (EtOAc/hexane) and subjected to further recrystallization (MeOH) to give 4-n-butyl-3,5-dimethylpyrrole benzyl ester. (22.92 g, yield 24%).

Step <5>
Acetic acid (200 ml) and acetic anhydride (3.09 ml) were added into a reaction vessel, into which 4-n-butyl-3,5-dimethylpyrrole benzyl ester (8.56 g, 30 mmol) was dissolved. Then, lead tetraacetate (15.38 g, 31.5 mmol) was slowly added to this solution. After stirring for 2 hours, the reaction solution was poured into ice water, and the formed precipitate was filtered and thoroughly washed with water. The precipitate was dissolved in chloroform, then washed with water, aqueous sodium bicarbonate solution and saturated saline. The obtained organic layer was dried over anhydrous sodium sulfate, and concentrated under reduced pressure. Trituration of the concentrate with hexane gave benzyl-5-acetoxymethyl-4-n-butyl-3-methylpyrrole-2-carboxylate (8.93 g, yield 87%).

Step <6>

Into a reaction vessel purged with nitrogen, 1-nitropropane (8.93 ml, 100 mmol) and dehydrated tetrahydrofuran (dry THF) (50 ml) were added. After 1,8-diazabicyclo[5.4.0]undec-7-ene (DBU) (1.5 ml, 10 mmol) was added, propionaldehyde (4.68 ml, 100 mmol) was added while cooling in an ice bath. After stirring for 10 hours at room temperature, ethyl acetate (100 ml) was added. The resulting solution was washed using dilute hydrochloric acid, water and saturated saline, and the obtained organic layer was dried over anhydrous sodium sulfate. The resulting solution was concentrated under reduced pressure to give 4-hydroxy-3-nitrohexane (12.33 g, yield 84%)

Step <7>

A reaction vessel was charged with 4-hydroxy-3-nitrohexane (14.7 g, 100 mmol), acetic anhydride (14.8 ml, 157.3 mmol), chloroform (50 ml) and a few drops of concentrated sulfuric acid, then stirred for hours at room temperature. After the reaction was finished, chloroform (50 ml) was added, and the resulting solution was washed with water, 5% aqueous sodium bicarbonate solution and saturated saline.

The obtained organic layer was dried over anhydrous sodium sulfate, and concentrated under reduced pressure, whereby 4-acetoxy-3-nitrohexane (16.3 g, yield 86%) was obtained.

Step <8>

A reaction vessel was charged with 4-acetoxy-3-nitrohexane (11.34 g, 60 mmol), purged with nitrogen, and charged with dry THF (150 ml) and ethyl isocyanoacetate (7.28 ml, 66-mmol). While cooling in an ice bath, DBU (20.76 ml, 144 mmol) was slowly added dropwise, and the solution was stirred for hours at room temperature. After the reaction was finished, 1N hydrochloric acid was added. The resulting solution was extracted with chloroform, the extract was washed with water and saturated saline and the obtained organic layer was dried over anhydrous sodium sulfate and concentrated under reduced pressure. Purification with silica gel column chromatography gave ethyl 3,4-diethylpyrolle-2-carboxylate (10.97 g, yield 94%).

Step <9>

A light-resistant reaction vessel equipped with a reflux condenser was charged with the ethyl-4,7-dihydro-4,7-ethano-2H-isoindole-1-carboxylate (1.95 g, 9.6 mmol) obtained in Step 2, 100 ml of ethylene glycol and 2.0 g of potassium hydroxide. The vessel was then purged with nitrogen, and the mixture was stirred for 2 hours at 175° C. The reaction mixture was then cooled to room temperature, and poured into ice water. The resulting solution was extracted with chloroform, the extract was washed with saturated saline and the obtained organic layer was dried over anhydrous sodium sulfate. Concentration of the solution under reduced pressure then gave 4,7-dihydro-4,7-etano-2H-isoindole (0.98 g, yield 70.4%).

Step <10>

A light-resistant reaction vessel equipped with a reflux condenser was charged with the ethyl 3,4-diethylpyrolle-2-carboxylate (2.056 g, 10.53 mmol), obtained in Step 8, ethylene glycol (100 ml) and potassium hydroxide (3.5 g), purged with nitrogen, and stirred for 2.5 hours at 160° C. The reaction vessel was then cooled to room temperature, and poured into ice water. The resulting product was extracted with ethyl acetate, the extract was washed with aqueous sodium bicarbonate solution, water and saturated saline and the obtained organic layer was dried over anhydrous sodium sulfate and concentrated under reduced pressure. The light-resistant reaction vessel equipped with a reflux condenser was further charged with the 3,4-diethylpyrrole obtained in the present step, benzyl-5-acetoxymethyl-4-n-butyl-3-methylpyrrole-2-carboxylate (7.21 g, 21 mmol) obtained in Step 5, acetic acid (10 ml) and ethanol (150 ml), and refluxed for 18 hours. After refluxing, the reaction vessel was cooled to room temperature, charged with ethanol (50 ml) and left for 5 hours at 0° C. The precipitated crystals were filtered and 20; thoroughly washed with ethanol to give 2,5-bis(5-benzylcarbonyl-3-n-butyl-4-methyl-2-pyrroylmethyl)-3,4-dimethyl-1H-pyrrole (5.25 g, yield 72%) was obtained.

Step <11>

A three-neck flask was charged with 0.5 g of palladium carbon (Pd/C) and 20 ml of dry THF, purged with hydrogen, stirred for 30 minutes and a solution of 2,5-bis(5-benzylcarbonyl-3-n-butyl-4-methyl-2-pyrroylmethyl)-3,4-dimethyl-1H-pyrrole (2.09 g, 3.03 mmol) dissolved in dry THF (30 ml) was slowly added dropwise into the flask. This solution was stirred as such overnight at room temperature. After stirring, the solution was subjected to celite filtration. The filtrate was concentrated under reduced pressure, shielded from light, purged with nitrogen, then cooled using an ice bath. The resulting solution was added dropwise with trifluoroacetic acid (TFA) (5 ml), stirred for 10 minutes, then slowly dropped with trimethyl orthoformate ($CH(OMe)_3$) (10 ml), and stirred at 0° C. for 1 hour. This solution was neutralized with a 1M NaOH solution (diluted with a 1:1 mixed solution of methanol and water), then poured into ice water, thereby precipitating a brown solid. This solid was filtered, washed with water then rinsed with hexane to give 2,5-bis(5-formyl-3-n-butyl-4-methyl-2-pyrroylmethyl)-3,4-diethyl-1H-pyrrole (1.94 g, yield 60%)

Step <12>

A light-resistant reaction vessel was charged—with 4,7-dihydro-4,1-etano-2H-isoindole (0.12 g, 0.84 mmol) obtained in Step 9, 2,5-bis(5-formyl-3-n-butyl-4-methyl-2-pyrroylmethyl)-3,4-diethyl-1H-pyrrole (0.40 g, 0.84 mmol) obtained in step 11 and chloroform (200 ml), and purged with nitrogen. The solution was then was added with TFA (10.0 ml) and stirred for 18 hours at 50° C. After stirring, trithylamine (18.0 ml) was slowly added dropwise into the solution for neutralization. Then the resulting solution was added with chloranil (0.21 g, 0.84 mmol) and stirred overnight. The solution was then quenched with aqueous sodium thiosulfate. The obtained organic layer was washed with water and saturated saline, and dried over anhydrous sodium sulfate. The resulting product was added with zinc acetate and stirred for 2 days at room temperature, then washed with water and saturated saline, dried over anhydrous sodium sulfate, concentrated under reduced pressure and purified using silica gel column chromatography to give a monobicycloporphyrin zinc complex (0.17 g, yield 32%).

Step <13>

A reaction vessel was charged with the obtained monobicycloporphyrin zinc complex (0.052 g, 0.08 mmol), purged with nitrogen and charged with chloroform (10 ml) to dissolve the complex. To the vessel was slowly added trifluoroacetic acid (4.5 ml) and the solution was stirred for 1 hour. The reaction solution was poured into water. The resulting solution was extracted with chloroform and the extract was washed with saturated saline. The obtained organic layer was dried over anhydrous sodium sulfate and concentrated under reduced pressure to give a metal-free monobicycloporphyrin represented by the following general formula (3) (0.038 g, yield 81%).

General Formula (3):

Step <14>

A reaction vessel was charged with the obtained metal-free monobicycloporphyrin (0.041 g, 0.07 mmol), purged with nitrogen and charged with chloroform (25 ml) to dissolve the metal-free monobicycloporphyrin. To the solution was added copper (II) acetate monohydrate (0.028 g, 0.14 mmol) and stirred overnight. The reaction solution was poured into water. The resulting solution was extracted with chloroform and the extract was washed with saturated saline. The obtained organic layer was dried over anhydrous sodium sulfate and concentrated under reduced-pressure to give a monobicycloporphyrin copper complex (0.038 g, yield 87%).

Example 1

Figure 3:
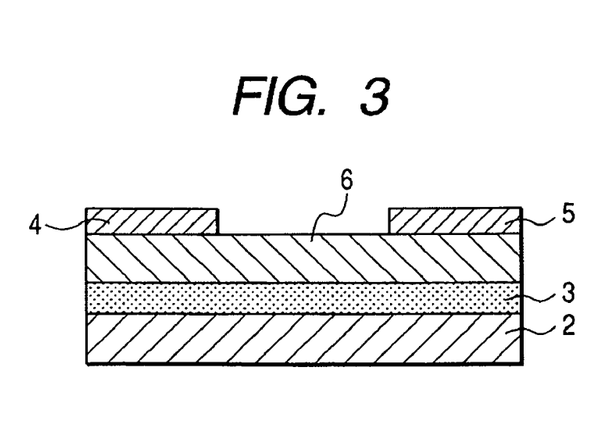
FIG. 3 illustrates the configuration of Example 1 in accordance with the present invention, and is an expanded cross-sectional view schematically illustrating a part of a top electrode type field effect transistor.

FIG. 3 shows the structure of a top electrode type field effect transistor in accordance with the present example.

First, a highly-doped N-type silicon substrate was prepared as the gate electrode 2. A silicon oxide film with a thickness of 5,000 Å obtained by thermally oxidizing the surface layer of the silicon substrate was used as the gate insulating layer 3. A 1% by weight solution of the monobicycloporphyrin copper complex synthesized in Synthesis Example 1 in chloroform (the monobicycloporphyrin copper complex was completely dissolved in the chloroform) was spin-cast on the substrate to form a coating. Subsequently, the substrate was heated to 220° to form an organic semiconductor layer 6 composed of the monobenzoporphyrin copper complex. The organic semiconductor layer had a film thickness of 120 nm. Gold was vapor-deposited thereon using a mask to form the source electrode 4 and drain electrode 5. The electrode preparation conditions were as follows. The degree of vacuum in the vapor-deposition apparatus chamber was $1.33 \times 10^{-4}$ Pa ($1 \times 10^{-6}$ Torr), the substrate temperature was room temperature and the film thickness was 100 nm.

A field effect transistor with a channel length of 50 μm and a channel width of 3 mm was prepared according to the above procedure. The Vd-Id and Vg-Id curves of the prepared transistor were measured using a Parameter Analyzer-4156C (trade name) manufactured by Agilent Technologies.

The mobility μ ($cm^2/Vs$) was calculated according to the following equation (1).

$$Id = \mu(CiW/2L)(Vg-Vth)^2 \quad \text{(Equation: 1)}$$

wherein Ci denotes electrostatic capacity ($F/cm^2$) per unit area of the gate insulating film; W and L respectively denote a channel width (mm) and a channel length (am) shown in the example; and Id, Vg and Vth respectively denote a drain current (A), a gate voltage (V) and a threshold voltage (V). Further, the ratio of Id for Vg=−80 V and Id for 0 V at Vd=−80 V was defined as an ON/OFF ratio.

Figure 4:
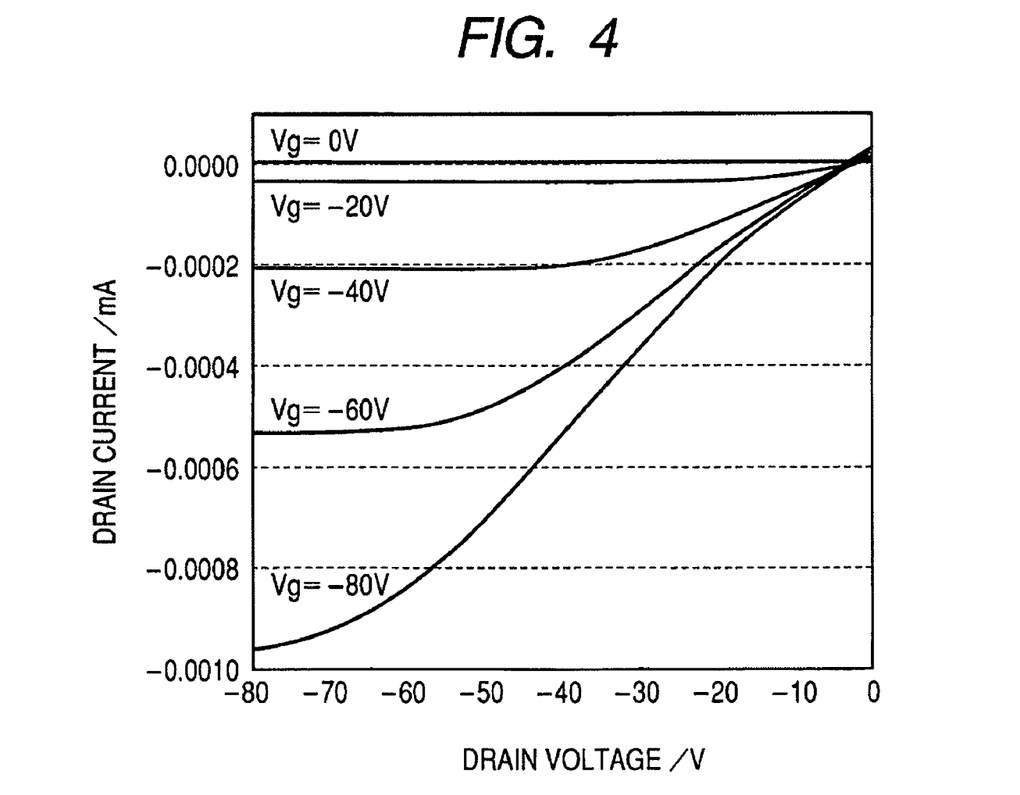
FIG. 4 is a diagram illustrating the electrical characteristics of the field effect transistor of Example 1 of the present invention.

As a result, a Vd-Id curve as shown in FIG. 4 was obtained from the measurement. The obtained results showed that the transistor had a field-effect mobility of $1.3 \times 10^{-3}$ $cm^2/V \cdot s$ and an ON/OFF ratio of $1.0 \times 10^3$ to $6.1 \times 10^6$.

Figure 5:
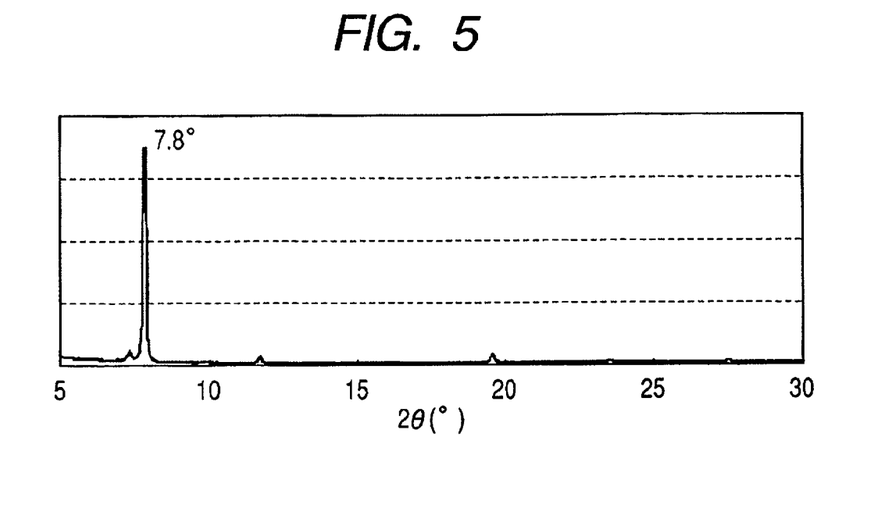
FIG. 5 is an X-ray diffraction pattern obtained in Example 1 of the present invention.

Further, Cu K-alpha X-ray diffraction of the transistor substrate prepared under the above mentioned conditions showed an extremely strong peak at Bragg angle (2θ) 7.8°±0.2°. The results are shown in FIG. 5.

Figure 6:
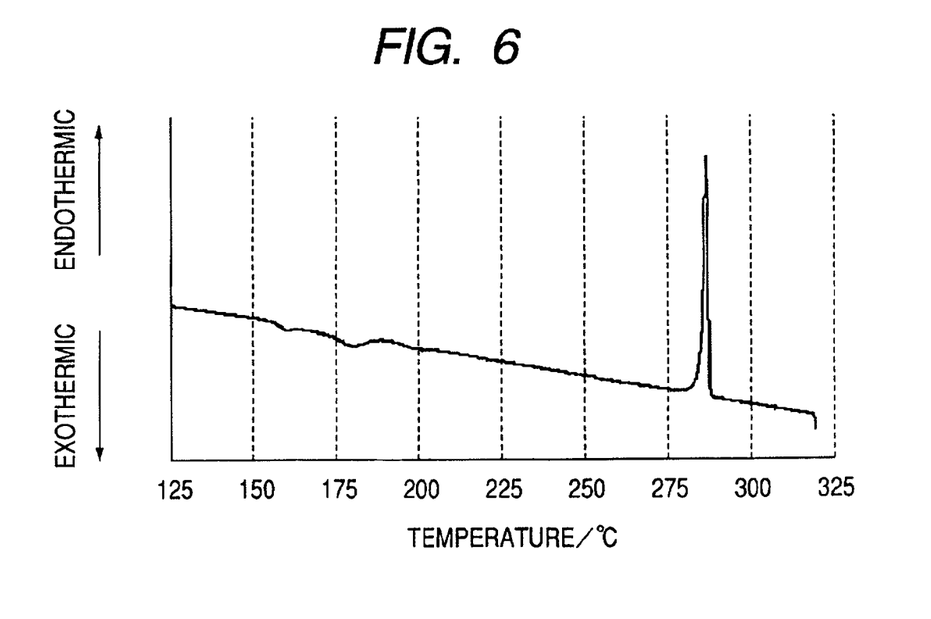
FIG. 6 illustrates the results of differential thermal analysis obtained in Example 1 of the present invention.

Moreover, differential thermal analysis of the monobicycloporphyrin copper complex using Pyris 1 DSC (trade name) manufactured by PerkinElmer, Inc., showed an exothermic peak at 155° C. to 190° C. and an endothermic peak at 280° C. to 292° C. thought to be derived from the melting point. The results are shown in FIG. 6.

A solution of 1 wt % monobicycloporphyrin in chloroform was spin-coated to a quartz substrate to form a film. The ultraviolet-visible light absorption spectrum of the film was observed using Spectrophotometer U3310 (trade name) manufactured by Hitachi Ltd.

Figure 7:
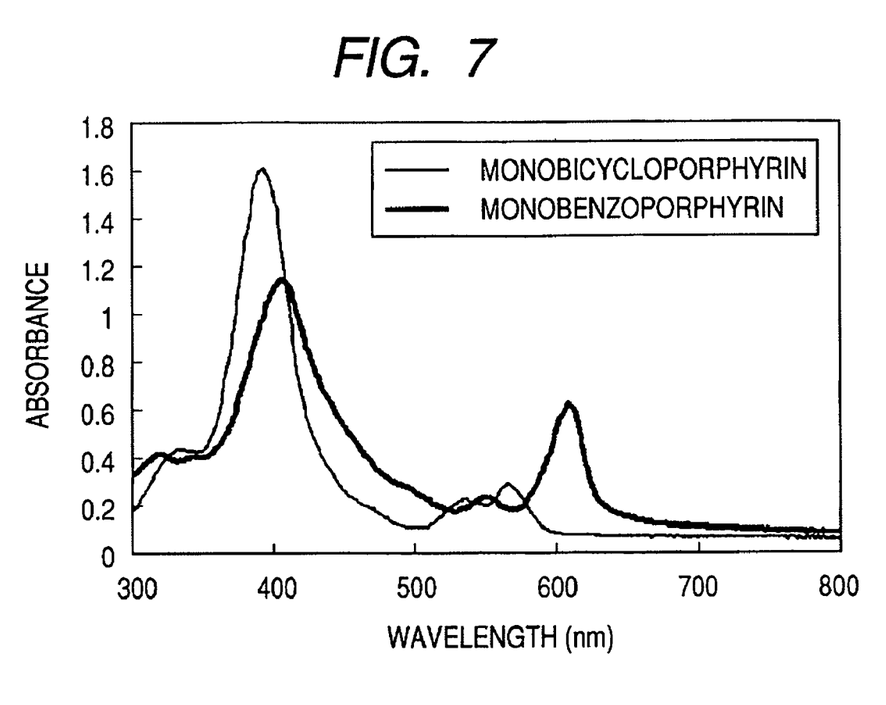
FIG. 7 illustrates the results of the ultraviolet-visible light absorption spectrum obtained in Example 1.

Further, the ultraviolet-visible light absorption spectrum of a film coated in the same manner to a quartz substrate, then converted to monobenzoporphyrin by heating at 220° C., was also observed. The results are shown in FIG. 7.

Example 2

A field effect transistor was prepared by following the same procedure as in Example 1 with the exception that the heating temperature 220° C. used in Example 1 was changed to 180° C. It was confirmed that the conversion to the benzo compound was completed in $9.0 \times 10^2$ seconds. The transistor had a field-effect mobility of $7.2 \times 10^{-4}$ $cm^2/V \cdot s$ and an ON/OFF ratio of from $2.0 \times 10^3$ to $3.0 \times 10^4$.

Example 3

A field effect transistor was prepared by following the same procedure as in Example 1 with the exception that the heating temperature 220° C. used in Example 1 was changed to 160° C. It was confirmed that the conversion to the benzo compound was completed in $2.7 \times 10^3$ seconds. The transistor had a field-effect mobility of $5.8 \times 10^{-4}$ $cm^2/V \cdot s$ and an ON/OFF ratio of $1.3 \times 10^4$.

Example 4

A field effect transistor was prepared by following the same procedure as in Example 1 with the exception that the organic semiconductor layer was formed according to the following procedure. The monobicycloporphyrin copper complex was converted to a monobenzoporphyrin copper complex by heating to 200° C., and the monobenzoporphyrin copper complex was then vacuum-deposited on the substrate to form the organic semiconductor layer 6. The vacuum deposition conditions were such that the substrate was fixed on an upper part of a vapor-deposition boat, the substrate temperature was set at 220° C. and the degree of vacuum was lowered to $1.33 \times 10^{-4}$ Pa ($1.0 \times 10^{-6}$ Torr). Then, vacuum deposition was performed to a thickness of 100 nm at a rate of 0.05 to 0.15 nm per minute.

A field effect transistor with a channel length of 50 μm and a channel width of 3 mm was prepared according to the above procedure. The transistor had a field-effect mobility of $1.0 \times 10^{-3}$ cm²/V·s and an ON/OFF ratio of $1.0 \times 10^3$ to $1.5 \times 10^5$.

Example 5

A field effect transistor was prepared by following the same procedure as in Example 1 with the exception that the metal-free monobicycloporphyrin synthesized in Synthesis Example 1 was used in place of the monobicycloporphyrin copper complex used in Example 1.

Figure 8:
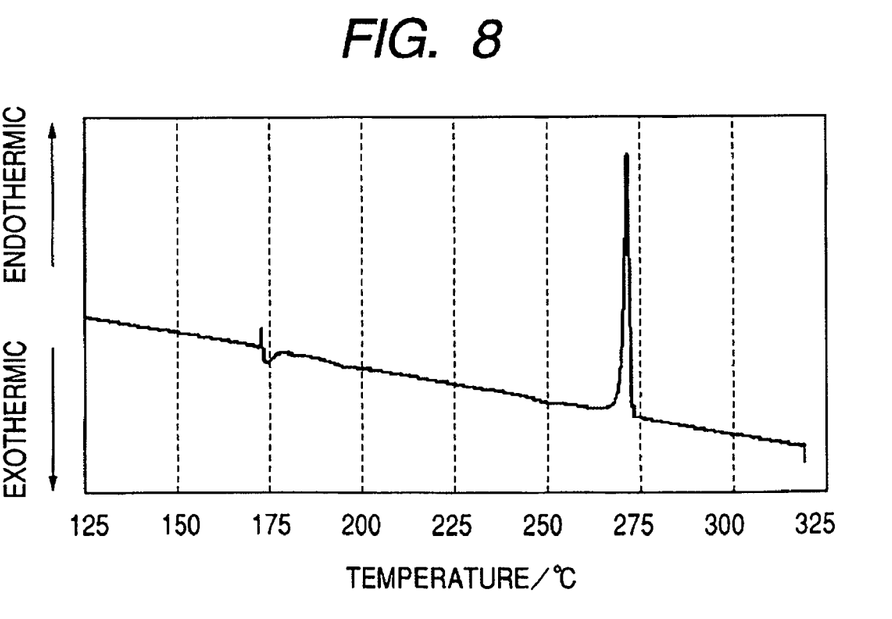
FIG. 8 illustrates the results of differential thermal analysis obtained in Example 5.

The transistor had a field-effect mobility of $8.0 \times 10^{-4}$ cm²/V·s and an ON/OFF ratio of $1.0 \times 10^2$ to $1.0 \times 10^3$. Differential thermal analysis of the metal-free monobicycloporphyrin using a Pyris 1 DSC (trade name) manufactured by PerkinElmer, Inc., showed an exothermic peak at 160° C. to 180° C. and an endothermic peak at 260° C. to 275° C. thought to be derived from the melting point. The results are shown in FIG. 8.

Figure 9:
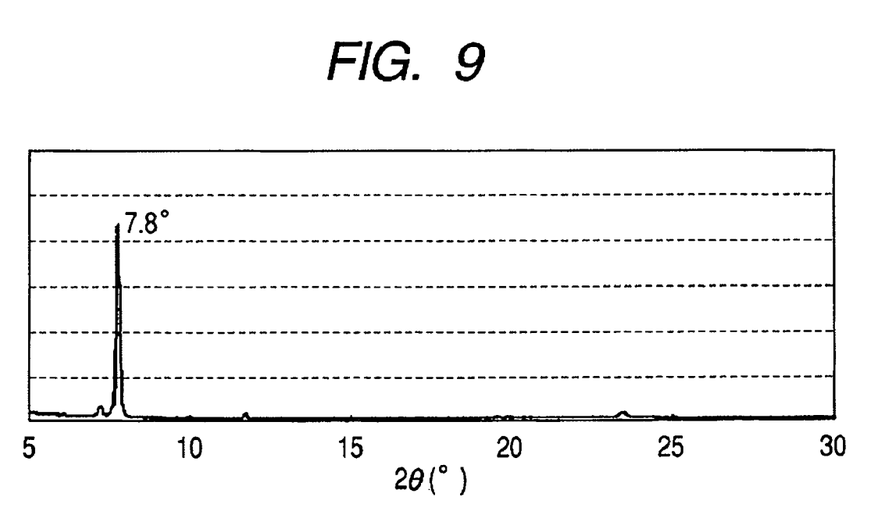
FIG. 9 is an X-ray diffraction pattern obtained in Example 5 of the present invention.

Moreover, Cu K-alpha X-ray diffraction of the prepared transistor substrate prepared according to the above-described conditions showed an extremely strong peak at Bragg angle (2θ) 7.8°±0.2°. The results are shown in FIG. 9.

Comparative Example 1

An unsubstituted monobicycloporphyrin zinc complex represented by general formula (4) was synthesized. Although an attempt was made to prepare a field effect transistor by following the same procedure as in Example 1, the solubility was poor, so that a 1% by weight concentration solution in chloroform could not be prepared.

General Formula (4)

This application claims priority from Japanese Patent Application No. 2004-087077 filed on Mar. 24, 2004, which is hereby incorporated by reference herein.

The invention claimed is:

1. A field effect transistor comprising an organic semiconductor layer comprising a compound having a monobenzoporphyrin skeleton obtained by heating a metal-free monobicycloporphyrin compound represented by the general formula (3):

or a copper complex thereof.

2. The field effect transistor according to claim 1, wherein the organic semiconductor layer has at least one peak at Bragg angle (2θ) 7.8°±0.2° in terms of Cu K-alpha X-ray diffraction.

* * * * *